(12) United States Patent
Kawai et al.

(10) Patent No.: US 9,277,681 B2
(45) Date of Patent: Mar. 1, 2016

(54) ELECTRONIC CONTROL APPARATUS (71) Applicant: HITACHI AUTOMOTIVE SYSTEMS, LTD., Ibaraki (JP)

(72) Inventors: Yoshio Kawai, Ota (JP); Takayuki Fukuzawa, Isesaki (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 210 days.

(21) Appl. No.: 13/783,476

(22) Filed: Mar. 4, 2013

(65) Prior Publication Data

US 2013/0250521 A1  Sep. 26, 2013

(30) Foreign Application Priority Data

Mar. 21, 2012  (JP) ................. 2012-064315

(51) Int. Cl.
*H05K 7/20* (2006.01)
*H05K 5/00* (2006.01)

(52) U.S. Cl.
CPC .......... *H05K 7/20854* (2013.01); *H05K 5/0082* (2013.01); *H01L 2924/0002* (2013.01)

(58) Field of Classification Search
None
See application file for complete search history.

(56) References Cited

U.S. PATENT DOCUMENTS

| 5,777,844 | A * | 7/1998 | Kiefer ............................ 361/704 |
| 6,696,643 | B2 * | 2/2004 | Takano .......................... 174/520 |
| 6,958,910 | B2 * | 10/2005 | Tanaka et al. .................. 361/699 |
| 7,031,165 | B2 * | 4/2006 | Itabashi et al. ................ 361/719 |
| 7,050,305 | B2 * | 5/2006 | Thorum ......................... 361/719 |
| 7,082,034 | B2 * | 7/2006 | Tiwari et al. ................... 361/719 |
| 8,199,509 | B2 * | 6/2012 | Akabori et al. ............... 361/719 |
| 2003/0184969 | A1 * | 10/2003 | Itabashi et al. ................ 361/688 |
| 2005/0078456 | A1 * | 4/2005 | Mandel et al. ................. 361/719 |
| 2007/0268671 | A1 * | 11/2007 | Brandenburg et al. ........ 361/704 |
| 2011/0228498 | A1 * | 9/2011 | Kawai et al. ................... 361/752 |

FOREIGN PATENT DOCUMENTS

| JP | 11-163566 A | 6/1999 |
| JP | 2003-289191 | 10/2003 |
| JP | 2007-123641 A | 5/2007 |

* cited by examiner

*Primary Examiner* — Courtney Smith (74) *Attorney, Agent, or Firm* — Foley & Lardner LLP (57) ABSTRACT An electronic control apparatus includes housing members, and a circuit board. At least one of the housing members is opposed to a heat-generating region which is heated by the heat-generating electronic component. A heat radiating portion of the housing member includes a convex portion protruding from an inner wall surface at a location opposed to the heat-generating region, and a concave portion opened to an outer wall surface at a location shifted from the convex portion in a thickness direction. The convex portion is close to the heat-generating region through a clearance. The concave portion has a lateral wall formed in a tapered shape such that an opening area of the concave portion is larger than a bottom area of the concave portion. A thickness of the heat radiating portion is smaller than a thickness of a region peripheral to the heat radiating portion in the housing member.

4 Claims, 4 Drawing Sheets

ELECTRONIC CONTROL APPARATUS

BACKGROUND OF THE INVENTION

The present invention relates to an electronic control apparatus accommodating a circuit board in an internal protection space of a housing of the electronic control apparatus.

An electronic control apparatus mounted in a vehicle, such as an engine control unit and a control unit for automatic transmission generally includes a housing formed by combining a plurality of housing members with each other. An internal protection space (i.e., a space having a waterproof property and the like) of the housing accommodates a circuit board on which electronic components are mounted. These electronic components include electronic components such as a condenser, and heat-generating electronic components such as an arithmetic processing unit (CPU) and a semiconductor switching element which generate heat based on those actions.

In such a case, the heat-generating electronic component itself and an opposite-surface portion of the circuit board which corresponds to a location of the heat-generating electronic component are heated. In order to suppress a temperature increase of this heated portion (especially, the electronic component), a structure is conceivable in which a heat of the heated portion is transferred to an inner wall surface of the housing member and then is radiated through an outer wall surface of the housing member into the atmosphere. U.S. Patent Application Publication No. 2003/0184969 corresponding to the family Japanese Patent Application Publication No. 2003-289191 discloses a previously proposed electronic control apparatus. In this technique, a convex portion protrudes from a portion of an inner wall surface of a housing which is opposed to the heated portion of the circuit board. This convex portion is close to the heated portion through a clearance.

SUMMARY OF THE INVENTION

Although the structure of the above Patent Application makes it easier to transfer the heat of the heated portion to a side of the housing member, there is a risk that the heat is not sufficiently radiated from the outer wall surface of the housing member into the atmosphere.

It is therefore an object of the present invention to provide an electronic control apparatus devised to improve a heat-radiation performance.

According to one aspect of the present invention, there is provided an electronic control apparatus comprising: a housing including a plurality of housing members combined with each other; and a circuit board received in an internal space of the housing, a heat-generating electronic component being mounted on the circuit board, wherein at least one of the plurality of housing members is opposed to a heat-generating region of the circuit board which is heated by the heat-generating electronic component, wherein the at least one of the plurality of housing members includes a heat radiating portion, wherein the heat radiating portion includes a convex portion protruding from an inner wall surface of the at least one of the plurality of housing members at a location opposed to the heat-generating region, the convex portion being close to the heat-generating region through a clearance between the convex portion and the heat-generating region, and a concave portion opened to an outer wall surface of the at least one of the plurality of housing members at a location shifted from the convex portion in a thickness direction of the at least one of the plurality of housing members, the concave portion having a lateral wall formed in a tapered shape such that an opening area of the concave portion is larger than a bottom area of the concave portion, wherein a thickness of the heat radiating portion is smaller than a thickness of a region peripheral to the heat radiating portion in the at least one of the plurality of housing members.

The other objects and features of this invention will become understood from the following description with reference to the accompanying drawings.

DETAILED DESCRIPTION OF THE INVENTION

Hereinafter, embodiments according to the present invention will be explained in detail with reference to the drawings.

<Configuration Example of Electronic Control Apparatus>

Figure 1:
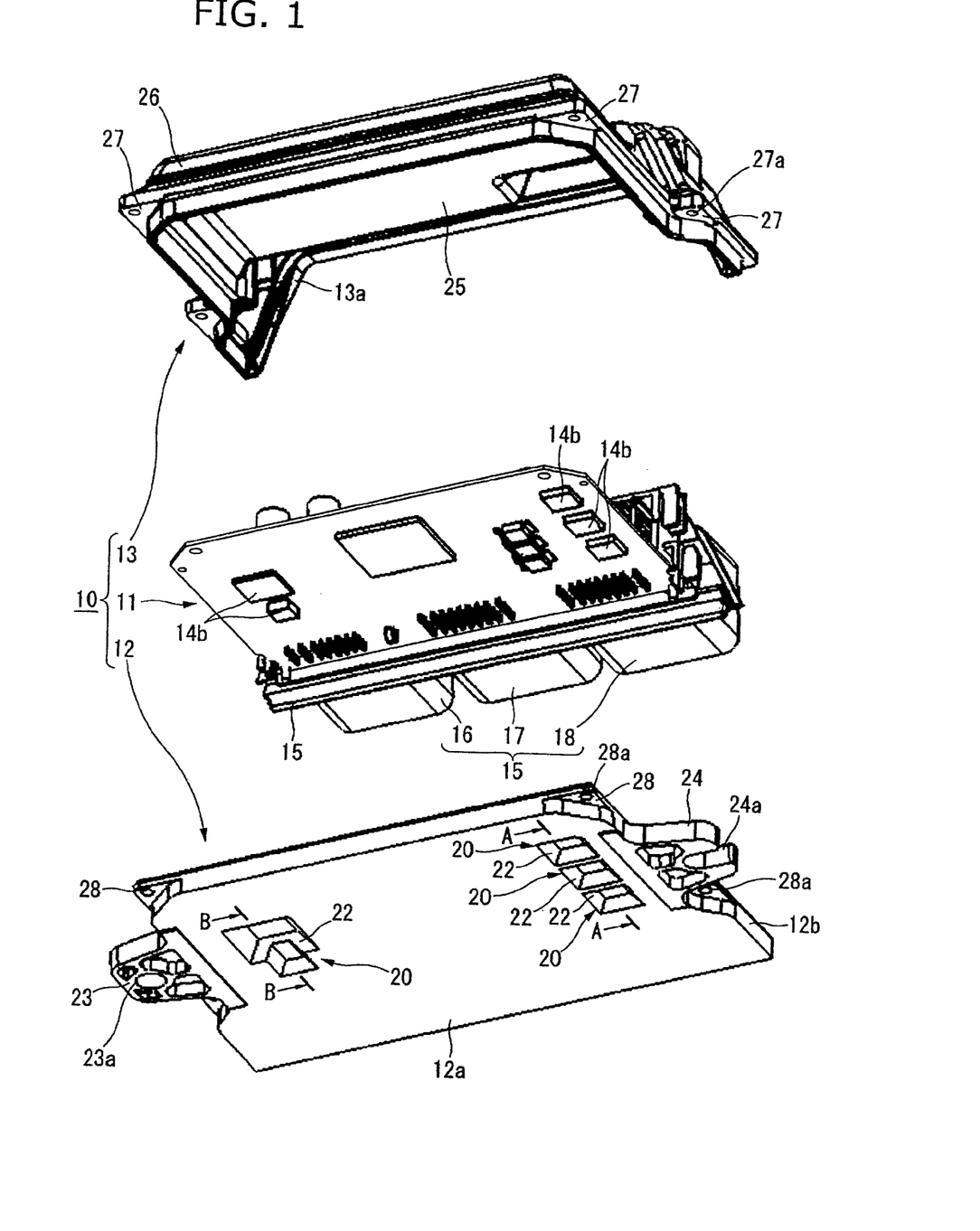
FIG. 1 is an exploded oblique perspective view showing one example of an electronic control apparatus according to an embodiment of the present invention, as viewed from an obliquely lower side.
Figure 2:
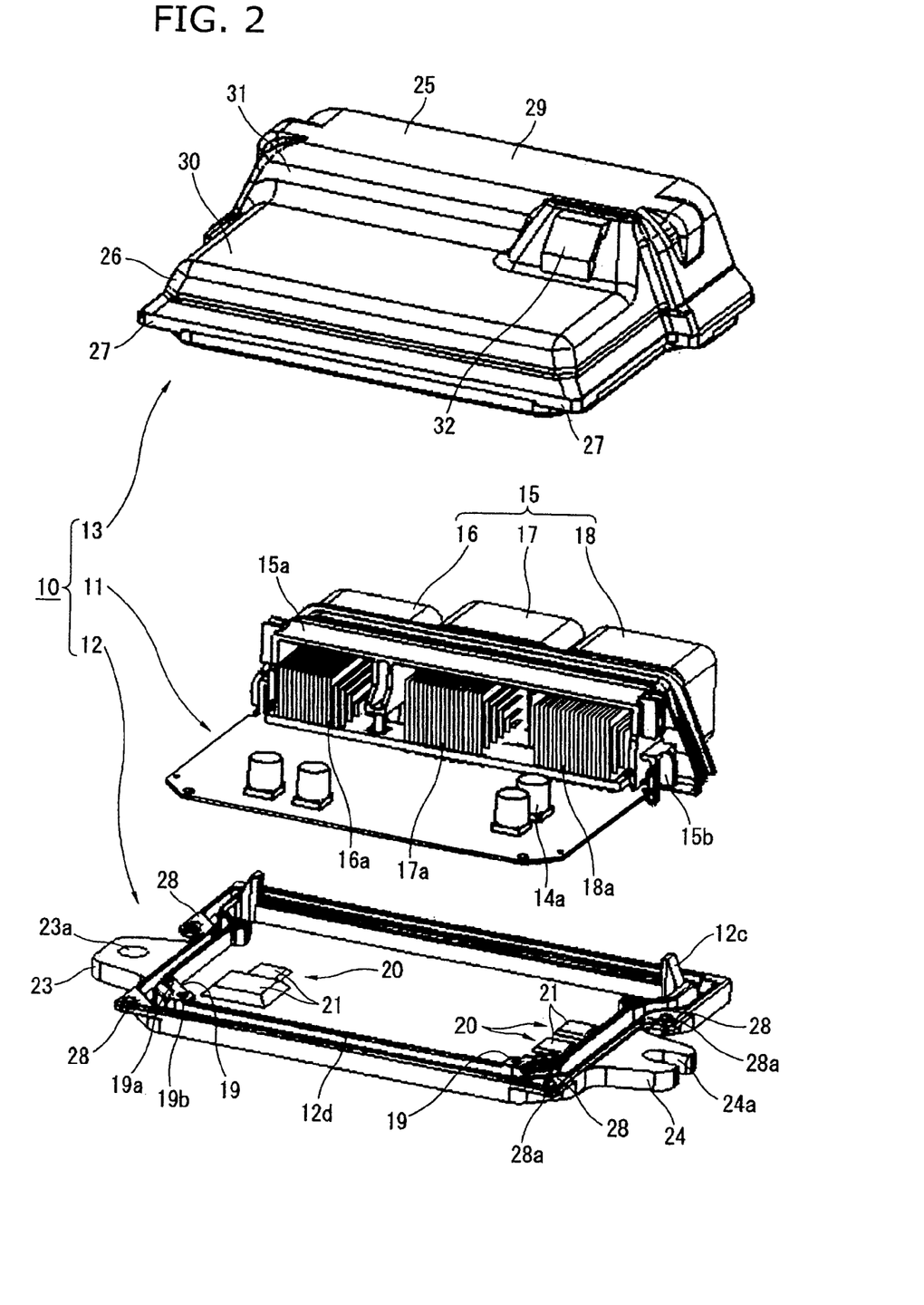
FIG. 2 is an exploded oblique perspective view showing the example of the electronic control apparatus according to the embodiment of the present invention, as viewed from an obliquely upper side.

Hereinafter, one example in which an electronic control apparatus of an embodiment according to the present invention is applied to an engine control unit of a vehicle (automobile) will be explained in detail referring to the drawings. At first, a basic structure of the electronic control apparatus 10 that accommodates a circuit board (circuit substrate) 11 in an internal space of a housing formed by combining a plurality of housing members (such as a case 12 and a cover 13 which will be mentioned later) with each other will now be explained referring to FIGS. 1 and 2. In the following explanations, an up-down direction of FIG. 1, i.e., a thickness direction of the circuit board 11 will be sometimes explained as an up-down direction of the electronic control apparatus 10 itself, for convenience sake. However, this direction does not necessarily mean a vertical direction (i.e., gravity direction) of the vehicle under a state where the electronic control apparatus 10 has been mounted in the vehicle. That is, for example, in a case that the electronic control apparatus 10 is installed in the vehicle in a posture where the thickness direction of the circuit board 11 is perpendicular to the vertical direction (gravity direction) of the vehicle, the up-down direction of the electronic control apparatus 10 of FIG. 1 means a front-rear direction of the vehicle.

The electronic control apparatus 10 mainly includes a housing and the circuit board 11. The housing is formed by liquid-tightly connecting the case 12 with the cover 13, i.e., by connecting the case 12 with the cover 13 through a seal material (seal member). The case 12 is formed substantially in a plate shape, and is attached to a side of vehicle body of the vehicle. The cover 13 is formed substantially in a box shape. The circuit board 11 is accommodated and received in a protection space given inside the housing. Electronic components 14a and 14b are mounted on the circuit board 11. The electronic control apparatus 10 is mounted in an engine room or the like (not shown), and is attached to the side of vehicle body at bottom surfaces of brackets 23 and 24 of the case 12 each of which functions as an attaching surface to the vehicle body. In this embodiment, these attaching surfaces (the bottom surfaces of the brackets 23 and 24) by which the electronic control apparatus 10 is mounted on the vehicle body side are formed to be parallel to a bottom surface of a bottom wall 12a of the case 12. However, the attaching surfaces (the bottom surfaces of the brackets 23 and 24) may be inclined relative to the bottom surface of the bottom wall 12a of the case 12, in dependence upon a shape and the like of the attaching section to the vehicle body (i.e., in dependence upon shapes of the brackets 23 and 24).

The electronic components 14a are mounted in an upper side (i.e., on a cover-side surface) of the circuit board 11. Each of the electronic components 14a is an almost no-heat-generating component such as a condenser and a coil, or a low-heat-generating component such as a heat sink that does not need a particular heat-radiation treatment. The electronic components 14b are mounted in an lower side (i.e., on a case-side surface) of the circuit board 11. Each of the electronic components 14b is an electronic component that relatively easily generates heat (hereinafter referred to as a heat-generating electronic component), such as an arithmetic processing unit, a transistor and an IC. The circuit board 11 is a so-called printed-wiring board. For example, a wiring circuit pattern is formed on two surfaces (upper and lower surfaces) and/or at an inside portion of a board material formed of glass epoxy resin or the like, and then, this wiring circuit pattern is electrically connected with the electronic components 14a and the heat-generating electronic components 14b by soldering and the like. Thus, the circuit board 11 is formed.

The connector 15 is attached to one part of a circumferential-edge portion of the circuit board 11. The connector 15 includes a first connecting port 16, a second connecting port 17 and a third connecting port 18 which are connected respectively to external connectors. In this embodiment, the connecting ports 16, 17 and 18 divided into three are provided for convenience of the external connectors. The connector 15 further includes an attaching base portion 15a. That is, the connector 15 is formed by integrating the respective connecting ports 16, 17 and 18 with one another through the attaching base portion 15a. The connector 15 is fixed (fastened) to the circuit board 11 through the attaching base portion 15a, for example, by a plurality of screws. The series of connecting ports 16, 17 and 18 which are combined with one another by the attaching base portion 15a is exposed (open) to the external through a window portion 13a of the cover 13. The window portion 13a is a space formed between the case 12 and the cover 13. The connecting ports 16, 17 and 18 located in the window portion 13a are connected with the external connectors (vehicle-body-side connectors). An outer circumferential portion of the attaching base portion 15a is formed with a guide groove 15b. The guide groove 15b functions to guide the case 12 to a predetermined position and to fix the case 12 to the circuit board 11. That is, an after-mentioned positioning protrusion(s) 12c which protrudes from a circumferential edge portion of the bottom wall 12a of the case 12 in the upper direction (in the direction toward the cover 13) in a standing manner is fitted into the guide groove 15b.

The connector 15 includes a plurality of male terminals 16a, 17a and 18a which are accommodated in the connecting ports 16, 17 and 18 and which are electrically connected with the wiring circuit pattern of the circuit board 11. These male terminals 16a, 17a and 18a are connected respectively with a plurality of female terminals accommodated in the external connector (not shown). Thereby, the wiring circuit pattern of the circuit board 11 is electrically connected through the connector 15 to predetermined devices such as sensor and pump connected with the external connectors (the female terminals).

The case 12 is formed substantially in a plate shape, more particularly, formed in a shallow cut-box shape as given by slightly projecting a circumferential edge of a bottom plate from the bottom plate in a direction perpendicular to the bottom plate. The case 12 is integrally formed of a metallic material having a high thermal conductivity such as aluminum. Specifically, the bottom wall 12a formed in a substantially rectangular plate shape includes an outer circumferential edge (four lateral sides) from which a lateral wall 12b projects toward the cover 13 in a standing manner. Accordingly, whole the case 12 is open in the upper direction, i.e., toward the cover 13. The positioning protrusion(s) 12c which is guided by and fitted into the guide groove 15b of the attaching base portion 15a is formed on an outer circumferential side of the bottom wall 12a. The lateral wall 12b includes cover fixing portions 28 for attaching and fixing the cover 13 to the case 12, at four corners of the lateral wall 12b. Each of the four cover fixing portions 28 is formed with a through-hole 28a passing through the cover fixing portion 28 in the up-down direction (i.e., in the direction perpendicular to the bottom wall 12a).

Moreover, the case 12 includes a heat radiating portion 20(s) having convex portion 21 and concave portion 22. Each of the convex portions 21 protrudes from an inner wall surface of the bottom wall 12a at a location facing (opposed to) the heat-generating electronic component 14b, under the state where the circuit board 11 has been fixedly attached to the case 12. Each of the concave portions 22 is a bottomed hole which open to the outer wall surface of the bottom wall 12a, i.e., which is depressed from the outer wall surface of the bottom wall 12a at a location corresponding to the convex portion 21 in a thickness direction of the convex portion 21. Each of the concave portions 22 includes a lateral wall and a bottom. The lateral wall of the concave portion 22 is formed in a shape tapered toward the bottom of the concave portion 22 so that an opening area of the concave portion 22 (in the outer wall surface of the bottom wall 12a) is larger than a bottom area of the concave portion 22. A thickness of the heat radiating portion 20 is thinner than a thickness of the bottom wall 12a located on a circumferential edge side of the heat radiating portion 20. That is, the thickness of the heat radiating portion 20 is smaller than that of a portion of the bottom wall 12a except the heat radiating portion 20. Moreover, a predetermined space (for example, a clearance smaller than 1 mm or a clearance of several millimeters) exists between the convex portion 21 and the heat-generating electronic component 14b.

A board fixing portion 19 is formed to protrude from a circumferential edge portion of the inner wall surface of the bottom wall 12a of the case 12 in the upper direction in a standing manner. In this embodiment, two board fixing portions 19 are provided at corners of the circumferential edge portion of the inner wall surface of the bottom wall 12a. The circuit board 11 is fixedly attached to the case 12 through the board fixing portions 19. Each of the board fixing portions 19 includes a supporting surface 19a at an upper end portion of the board fixing portion 19. The supporting surface 19a is flat and supports the circuit board 11. Each supporting surface 19a is formed with a female-threaded hole 19b. By screwing a bolt (not shown) into the female-threaded hole 19b, the circuit board 11 is fixed to the case 12 under a state where the circuit board 11 is received and supported by the board fixing portions 19.

Moreover, the case 12 includes a pair of brackets 23 and 24 on outer portions of the lateral wall 12b of the case 12. The pair of brackets 23 and 24 are formed integrally with the lateral wall 12b. The bracket 23 is formed with a through-hole 23a passing through the bracket 23 in the up-down direction (i.e., in the direction perpendicular to the bottom wall 12a). The bracket 24 is formed with a cutout groove (notched groove) 24a which passes through the bracket 24 in the up-down direction and which is open in the lateral direction (i.e., outer direction of the lateral wall 12b). By inserting bolts and the like into the through-hole 23a and the cutout groove 24a, the electronic control apparatus 10 is attached to the vehicle body (not shown).

The cover 13 is integrally molded by a predetermined synthetic-resin material which is lightweight and low-priced as compared with a metallic material. The cover 13 is formed substantially in an opened-box shape. The cover 13 includes an upper wall portion 25 and a lateral wall 26. The upper wall portion 25 covers the circuit board 11 and the connector 15 from an upper direction of the circuit board 11 and the connector 15 (i.e., from a side opposite to the case 12). The lateral wall 26 fences or surrounds a circumferential edge of the upper wall portion 25 except the window portion 13a. That is, the lateral wall 26 protrudes in the lower direction (toward the case 12) from three sides of the substantially-rectangular upper wall portion 25 except the window portion 13a to fence the three sides. The lateral wall 26 includes fixedly-connecting portions 27 at locations facing (opposed to) the cover fixing portions 28 of the case 12. Each of the fixedly-connecting portions 27 is formed with a female-threaded hole 27a. Each bolt (not shown) is inserted from a lower side of the case 12 through the through-hole 28a of the cover fixing portions 28 into the female-threaded hole 27a, and is screwed in the female-threaded hole 27a. Accordingly, the cover 13 is fixed to the case 12 under a state where the cover 13 has been supported by the cover fixing portions 28.

In order to ensure a waterproof performance, a lower circumferential edge portion of the cover 13 is bound to an upper circumferential edge portion of the case 12, liquid-tightly by a sealing agent. Also, a lower circumferential portion of the connector 15 is bound to the upper circumferential edge portion of the case 12, liquid-tightly by a sealing agent. Moreover, an inner circumferential edge portion of the window portion 13a is bound to an outer circumferential portion of the connector 15, liquid-tightly by a sealing agent. Although details of these binging portions (i.e., a binding portion between the lower circumferential edge portion of the cover 13 and the upper circumferential edge portion of the case 12, a binding portion between the lower circumferential portion of the connector 15 and the upper circumferential edge portion of the case 12, and a binding portion between the inner circumferential edge portion of the window portion 13a and the outer circumferential portion of the connector 15) are not shown in the drawings, each binding portion includes a sealing groove (e.g., 12d) formed in one-member side, and a protrusion formed in another-member side. Since this protrusion enters the sealing groove (e.g., 12d) with a clearance between the protrusion and the sealing groove (e.g., 12d), the clearance is filled with the sealing agent. Thus, a contact area of the sealing agent charged in the clearance between the protrusion and the sealing groove (e.g., 12d), i.e., a so-called sealing length is sufficiently secured to obtain a desired sealing performance. According to the present invention, the sealing agent is not limited to specific agents, so that any sealing agent having a flowability may be used. That is, an appropriate sealing agent can be selected from, for example, epoxy-based agents, silicon-based agents and acrylic agents, in accordance with specifications and requests of the electronic control apparatus 10.

As mentioned above, in the electronic control apparatus 10, the connector 15 open in the lateral direction (i.e., the direction parallel to the bottom wall 12a) is attached to one end of the circuit board 11. A dimension (height) of the circuit board 11 is different from a dimension (height) of the connector 15 with respect to the thickness direction of the circuit board 11. Therefore, the cover 13 is formed in a multi-level shape (stepped shape) in dependence upon the heights of the circuit board 11 and the connector 15. Specifically, the upper wall portion 25 which faces through the circuit board 11 and the connector 15 to the case 12 includes an upper-level portion 29 and a lower-level portion 30. The upper-level portion 29 and the lower-level portion 30 are parallel to the supporting surface 19a of the board fixing portion 19 of the case 12. The upper-level portion 29 covers (an above region of) the connecter 15, and the lower-level portion 30 covers (an above region of) the circuit board 11. The upper-level portion 29 has the dimension (height) larger than that of the lower-level portion 30 with respect to the thickness direction of the circuit board 11. The upper wall portion 25 of the cover 13 further includes a sloped wall portion 31 smoothly linking the upper-level portion 29 to the lower-level portion 30. This sloped wall portion 31 is in a flat shape and inclined at a predetermined inclination angle, specifically, substantially at 45 degrees relative to the bottom wall 12a of the case 12. Also relative to the upper-level portion 29 and the lower-level portion 30, the sloped wall portion 31 is inclined at the same inclination angle (45°). Moreover, a protection wall 32 is provided on the sloped wall portion 31. The protection wall 32 functions to protect an air-vent hole (not shown) formed to pass through the sloped wall portion 31 in the thickness direction of the circuit board 11. An air-venting waterproof membrane (thin membrane) such as Gore-Tex (registered trademark) which has both of waterproof and ventilation properties is attached to the air-vent hole. For example, when the vehicle is washed, the protection wall 32 protects the air-venting waterproof membrane from directly receiving a sprayed water having high temperature and high pressure.

Next, examples of the heat radiating portion of the electronic control apparatus 10 will now be explained in the embodiment according to the present invention.

FIRST EXAMPLE

Figure 3:
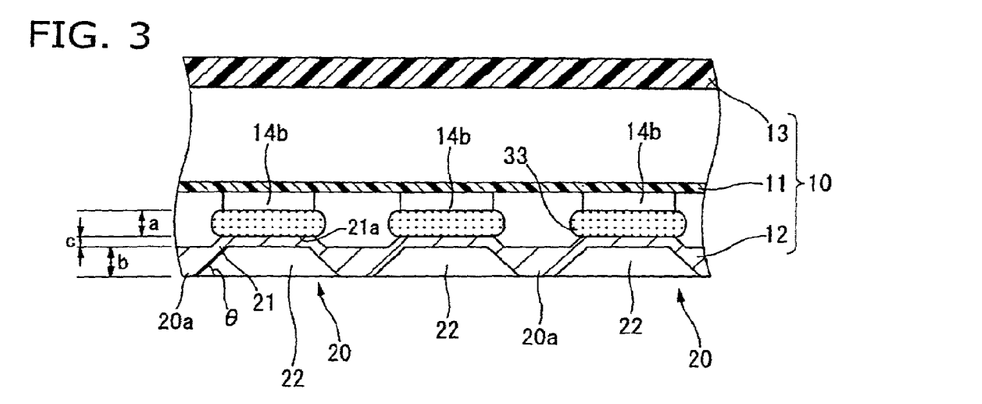
FIG. 3 is a schematic explanatory view of a heat radiating portion in a first example according to the present invention, as a rough cross-sectional view taken along an A-A line of FIG. 1.

In a first example, the heat radiating portion 20 formed by one convex portion 21 and one concave portion 22 is provided for one of the respective heat-generating electronic components 14b mounted in the lower side (i.e., on the case-side surface) of the circuit board 11. As shown in FIG. 3, each heat radiating portion 20 is formed at a location opposed to (i.e., a location facing) the heat-generating electronic component 14b mounted on the lower surface of the circuit board 11. Each heat radiating portion 20 is close to the heat-generating electronic component 14b through the clearance (distance "a" of FIG. 3). Each convex portion 21 includes a flat closest surface 21a at a tip side of the convex portion 21 which constitutes an upper portion (i.e., an inner portion) of the heat radiating portion 20. The flat closest surface 21a is formed in a shape similar to a lower surface (i.e., a case-side surface) of the heat-generating electronic component 14b. As mentioned above, the clearance exists between each flat closest surface 21a and the corresponding heat-generating electronic component 14b. In this clearance, an elastic heat-radiating material 33 is provided to be interposed between the flat closest surface 21a and the heat-generating electronic component 14b. The elastic heat-radiating material 33 is formed of a silicon-series resin material. The concave portion 22 which constitutes a lower portion (i.e., an outer portion) of the heat radiating portion 20 includes the lateral wall formed in a tapered shape which has a taper angle θ equal to 45 degrees with respect to a surface to which the concave portion 22 is open. That is, the angle θ between the lateral wall of the concave portion 22 and the lower surface (outer surface) of the bottom wall 12a is equal to 45°, as shown in FIG. 3. The heat radiating portion 20 including the convex portion 21 and the concave portion 22 has a wall thickness c thinner than a wall thickness b of a region 20a peripheral to (adjacent to) the heat radiating portion 20. This peripheral region 20a means a portion of the bottom wall 12a except the heat radiating portion 20 (i.e., except the convex portion 21 and the concave portion 22). In other words, the wall thickness c measured between the bottom of the concave portion 22 and the top surface (the flat closest surface 21a) of the convex portion 21 is smaller than the wall thickness b measured between the upper and lower surfaces of the bottom wall 12a. Thus, the heat radiating portion 20 constituted by the convex portion 21 and the concave portion 22 has a thin-walled structure.

In such an electronic control apparatus 10, when the heat-generating electronic component 14b generates heat, this heat is transferred through the elastic heat-radiating material 33 to the convex portion 21. Then, the heat is radiated through the concave portion 22 or the peripheral region 20a to the atmosphere. At this time, the heat is released in a radial (fan-like) fashion from the concave portion 22 because the lateral wall 22a of the concave portion 22 is formed in a tapered shape. Moreover, a convective flow easily occurs in the concave portion 22 by an air flow of the engine room and the like, so that a heat stagnation within the concave portion 22 is suppressed.

SECOND EXAMPLE

Figure 4:
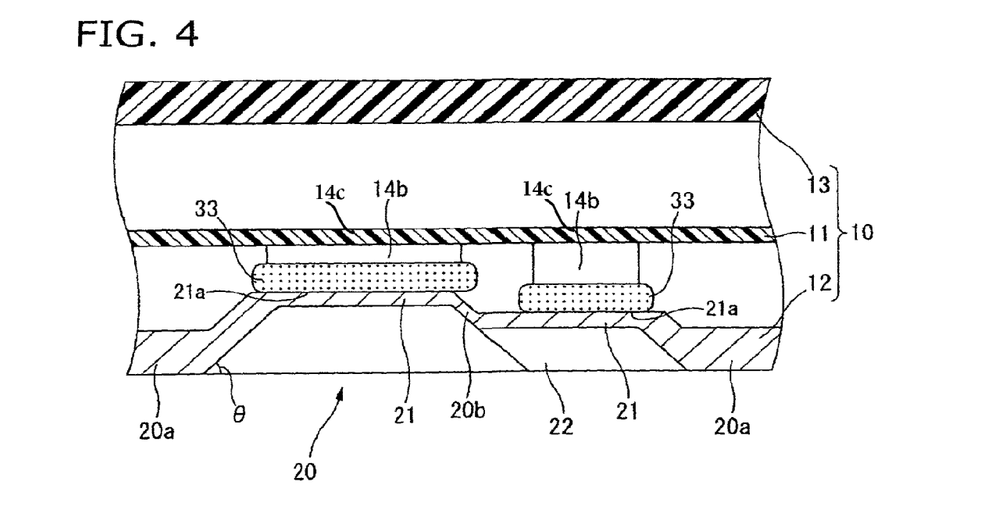
FIG. 4 is a schematic explanatory view of a heat radiating portion in a second example according to the present invention, as a rough cross-sectional view taken along a B-B line of FIG. 1.

In a second example according to the present invention, a heat radiating portion 20 formed by a plurality of convex portions 21 is provided for a plurality of heat-generating electronic components 14b which are mounted adjacent to each other on the lower surface of the circuit board 11. As shown in FIG. 4, the heat radiating portion 20 including the plurality of convex portions 21 is formed at a location opposed to (i.e., a location facing) two heat-generating electronic components 14b which are adjacent to each other and have shapes different from each other. The two convex portions 21 of the heat radiating portion 20 are respectively close to the two heat-generating electronic components 14b through the clearances therebetween. In the case of FIG. 4, the heat-generating electronic components 14b have thicknesses different from each other, with respect to the up-down direction of the drawings (i.e., with respect to the thickness direction of the circuit board 11). Hence, the heat radiating portion 20 is constituted by the convex portions 21 having shapes different from each other, so that an upper portion of the heat radiating portion 20 is formed in a multi-level shape (stepped shape) to have a level changing portion (a level-connecting sloped-wall portion) 20b. Each convex portion 21 includes the flat closest surface 21a at the tip side of the convex portion 21. The flat closest surface 21a is formed in a shape conforming to (depending on) the lower surface of the heat-generating electronic component 14b. In the clearance between each flat closest surface 21a and the corresponding heat-generating electronic component 14b, the elastic heat-radiating material 33 is provided to be interposed between the flat closest surface 21a and the heat-generating electronic component 14b.

Also in such an electronic control apparatus 10, the generated heat is radiated through the concave portion 22 or the peripheral region 20a into the atmosphere (to the external), in the same manner as in the first example.

THIRD EXAMPLE

Figure 5:
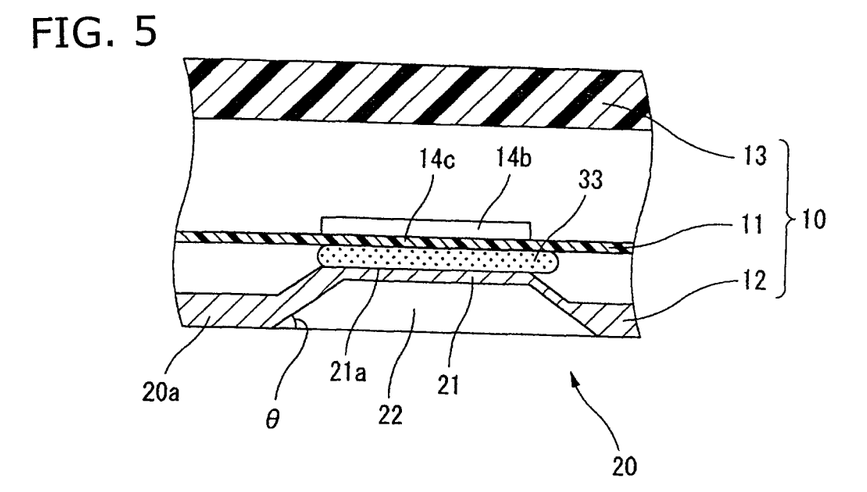
FIG. 5 is a schematic explanatory view of a heat radiating portion in a third example according to the present invention.

In a third example according to the present invention, the heat-generating electronic component 14b is mounted on the upper surface (i.e., the cover-side surface) of the circuit board 11. The heat radiating portion 20 is formed for a heat-generating region 14c which is a lower portion (i.e., a case-side portion) of the circuit board 11 and which is located directly below the heat-generating electronic component 14b. That is, the heat-generating region 14c is located at a lower side (opposite-surface side) of the circuit board 11 over an existing range of the heat-generating electronic component 14b mounted on the upper surface of the circuit board 11. As shown in FIG. 5, the heat radiating portion 20 is formed at a location opposed to (i.e., a location facing) the heat-generating region 14c. The heat radiating portion 20 is close to the heat-generating region 14c through a clearance. Each convex portion 21 includes the flat closest surface 21a at the tip of the convex portion 21 which constitutes the upper portion of the heat radiating portion 20. The flat closest surface 21a is formed in a shape conforming to a lower surface of the heat-generating region 14c. In a clearance between the flat closest surface 21a and the heat-generating region 14c, the elastic heat-radiating material 33 is provided to be interposed between the flat closest surface 21a and the heat-generating region 14c.

Also in such an electronic control apparatus 10, the generated heat is radiated through the concave portion 22 or the peripheral region 20a to the atmosphere, in the same manner as in the first example.

FOURTH EXAMPLE

Figure 6:
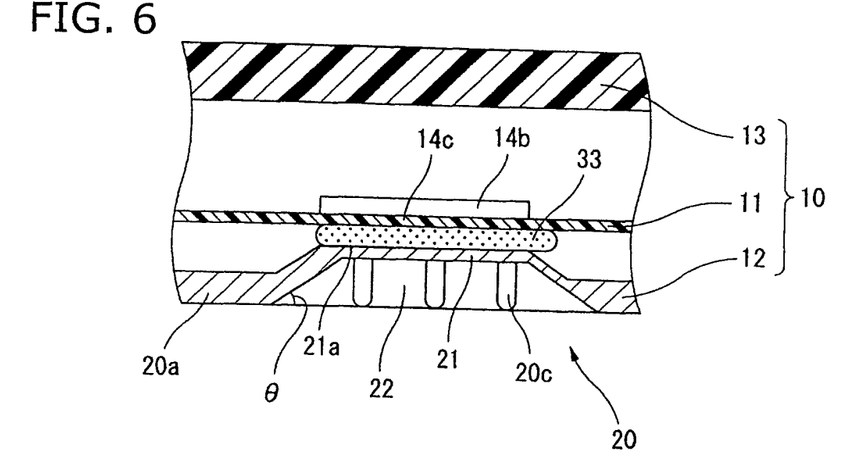
FIG. 6 is a schematic explanatory view of a heat radiating portion in a fourth example according to the present invention.

In a fourth example according to the present invention, the heat radiating portion 20 further includes a heat-radiating fin 20c inside the concave portion 22. As shown in FIG. 6, the heat-radiating fin(s) 20c is formed in a pin shape to project from the bottom surface of the concave portion 22 toward the opening surface of the concave portion 22. Also in this example, the generated heat is radiated through the concave portion 22 or the peripheral region 20a to the atmosphere, in the same manner as in the first example. Additionally, the heat can be radiated to the atmosphere also from the heat-radiating fins 20c.

<Representative Configurations and Advantageous Effects of Electronic Control Apparatus>

The electronic control apparatus in the embodiment according to the present invention includes the housing having the plurality of housing members (12, 13) combined with each other; and the circuit board (11) received in the internal space of the housing. The heat-generating electronic component (14b) is mounted on the circuit board (11). At least one of the housing members (12, 13) faces the heat-generating region of the circuit board (11) which is heated by the heat-generating electronic component (14*b*), i.e., faces the opposite-surface side of the circuit board at the location of the heat-generating electronic component (14*b*) or faces the heat-generating electronic component itself. The at least one of the plurality of housing members (12, 13) includes the heat radiating portion (20). The heat radiating portion (20) includes the convex portion (21) close to the heat-generating region, and also the concave portion (22) opened to the outer wall surface of the at least one of the housing members (12, 13) at a location shifted from the convex portion (21) in the thickness direction of the at least one of the housing members (12, 13). That is, the concave portion (22) is depressed in the outer wall surface to conform to the shape of the convex portion (21) protruding from the inner wall surface of the at least one of the housing members (12, 13). The concave portion (22) has the lateral wall formed in a tapered shape such that the opening area of the concave portion (22) is larger than the bottom area of the concave portion (22). Moreover, the thickness (c) of the heat radiating portion (20) is smaller than the thickness of a region peripheral to the heat radiating portion (20) in the at least one of the housing members (12, 13).

Because the heat radiating portion has a thin-wall structure as mentioned above, the heat of the heat-generating region is easily transferred to the outer wall surface of the housing member. In other words, whereas the heat radiating portion of the housing member is formed in a thin-wall structure, the region peripheral to the heat radiating portion can be formed in a thick-walled structure. Hence, a desired strength of the housing member can be secured while improving a heat-radiating performance by the above-mentioned heat-transfer property. The heat in the heat-generating region (the heat-generating electronic component itself or the opposite-surface side of the circuit board at the location of the heat-generating electronic component) might be transferred also to the peripheral region of the heat radiating portion, more than a little. However, this peripheral region is in the thick-walled structure to have a large heat-storage capacity, so that a heat concentration can be suppressed.

Because the lateral wall of the concave portion is in the tapered shape, a heat transferred to the concave portion is released in a radial (fan-like) fashion. Moreover, when an air flow occurs at a location peripheral to the concave portion (for example, air flow caused by a fan in a case that the electronic control apparatus is installed in the engine room), an accompanying air flow is easily caused along the tapered lateral-wall surface of the concave portion, so that a convective flow is caused. Thereby, the air flow existing near the concave portion gets into whole the concave portion, resulting in an effective heat radiation in the embodiment according to the present invention. Contrary to this, in a case of simple concave portion having no tapered lateral wall, it is difficult for the air flow existing near the concave portion to reach whole (corner portions of bottom surface and lateral-wall surface and the like) of the simple concave portion. Although the taper angle of the lateral wall of the concave portion in the embodiment according to the present invention is not limited to special values, for example, it is preferable that the taper angle is about 45 degrees with respect to the surface to which the concave portion is open.

The heat radiating portion (i.e., one thin-wall portion) may be formed for one heat-generating region (i.e., one heat-generating electronic component), or may be formed for a plurality of heat-generating regions (i.e., a plurality of heat-generating electronic components). In any case, it is preferable that shapes and sizes of the convex and concave portions are set in dependence upon the shape and size of the heat-generating region (the shape and size of the heat-generating electronic component). For example, in the case that the heat-generating region is a flat-plate-shaped electronic component or a reverse surface of the circuit board at a mounting position of the electronic component, i.e., in the case that a surface of the heat-generating region which faces the heat radiating portion is in a plane shape; it is preferable that the convex portion of the heat radiating portion is formed to have a flat surface (the flat closest surface) at the tip of the convex portion such that the flat surface of the convex portion is uniformly close to the heat-generating region. This flat closest surface may be formed to have a size (area) equal to or larger than that of the surface of the heat-generating region which faces the convex portion.

In the case that one heat radiating portion (i.e., one thin-wall portion) is provided to the plurality of heat-generating regions, i.e., provided to the plurality of heat-generating electronic components which have shapes (such as thickness or size) different from each other and which are mounted adjacent to each other; one heat radiating portion may include a plurality of convex portions. That is, in the electronic control apparatus according to the present invention, the heat radiating portion is not limited to the structure including one pair of convex and concave portions. In the case that the heat radiating portion includes the plurality of convex portions, for example, a surface of the heat radiating portion which faces the heat-generating regions (the heat-generating electronic components) is formed in a stepped shape defined by the plurality of convex portions. Moreover, the tip of each convex portion is formed as the flat closest surface having a shape conforming to the shape of the corresponding electronic component. As a concrete example, if heights (thicknesses) of the plurality of adjacent electronic components are different from each other in the thickness direction of the circuit board; the respective flat closest surfaces form a multi-level shape (stepped shape) conforming to the heights of the plurality of adjacent electronic components, and the bottom surfaces of the corresponding concave portions also form a multi-level shape (stepped shape). That is, a multi-level-shaped bottom as defined by causing the concave portions having depths different from each other to overlap with each other as viewed in the thickness direction conforms in shape to the multi-level-shaped top surface as defined by causing the convex portions having heights different from each other to overlap with each other.

According to the embodiment of the present invention, the heat-radiating fin (e.g., a pin-shaped fin which projects from the bottom surface of the concave portion) may be provided in the concave portion. In this case, a surface area for heat radiation can be enlarged to promote the heat radiation. According to the present invention, the shape of this heat-radiating fin is not limited to a special shape. For example, in a case that the heat-radiating fin is provided so as not to protrude from the opening surface of the concave portion, i.e., is provided completely within the concave portion; an appearance of the housing is favorable, and also the size of the electronic control apparatus is not enlarged while improving the heat-radiation performance.

By interposing the elastic heat-radiating material between the heat-generating region and the heat radiating portion, heat of the heat-generating region is transferred to the housing member more easily. Any elastic heat-radiating material which is generally used in a field of electronic control apparatus can be applied to the embodiment according to the present invention. For example, a heat-radiating material which is formed of silicon-series resin and which is in an elastic gel state can be applied to the electronic control apparatus according to the present invention. Moreover, for example, it is more preferable that a heat-radiating material is used which has an adhesiveness in addition to the elasticity because a position slip can be prevented in the clearance between the heat-generating region and the heat radiating portion. Furthermore, for example, it is more preferable that a heat-radiating material is used which has a resistance to environment and hence maintains the heat-radiation performance for a long term.

Although the material of which the housing member is made is not limited to a special material, it is preferable that the housing member in which the heat radiating portion is formed is made of a material having a high heat-conductivity. For example, the housing member-including the heat radiating portion is integrally molded of metallic material (such as aluminum, iron or the like) in a desired shape by means of a molding method or a casting method (such as die-casting). Moreover, in order to enhance a rate of heat emission from the surface of the housing member, for example, a thin-film insulation treatment (e.g., a surface treatment by alumite or a coating treatment by cation electrodeposition) may be applied to the surface of the housing.

Although the invention has been described above with reference to certain embodiments and examples of the invention, the invention is not limited to the embodiments and examples described above. Modifications and variations of the embodiments and examples described above will occur to those skilled in the art in light of the above teachings.

This application is based on a prior Japanese Patent Application No. 2012-64315 filed on Mar. 21, 2012. The entire contents of this Japanese Patent Application are hereby incorporated by reference.

The scope of the invention is defined with reference to the following claims.

What is claimed is:

1. An electronic control apparatus comprising:
a housing including a plurality of housing members combined with each other, and
a circuit board received in an internal space of the housing, a heat-generating electronic component being mounted on the circuit board,
wherein at least one of the plurality of housing members is opposed to a heat-generating region of the heat-generating electronic component,
wherein the at least one of the plurality of housing members includes at least one heat radiating portion,
wherein the at least one heat radiating portion includes
a convex portion protruding from an inner wall surface of the at least one of the plurality of housing members at a location opposed to the heat-generating region, the convex portion being close to the heat-generating region through a clearance between the convex portion and the heat-generating region, and
a concave portion opened to an outer wall surface of the at least one of the plurality of housing members at a location shifted from the convex portion in a thickness direction of the at least one of the plurality of housing members, the concave portion having a lateral wall formed in a tapered shape such that an opening area of the concave portion is larger than a bottom area of the concave portion,
wherein a thickness of the at least one heat radiating portion is smaller than a wall thickness of a region adjacent to the at least one heat radiating portion in the at least one of the plurality of housing members,
wherein the heat-generating region is included in a plurality of heat-generating regions,
wherein the heat-generating electronic component is included in a plurality of heat-generating electronic components mounted on the circuit board,
wherein the convex portion is included in a plurality of convex portions,
wherein the at least one heat radiating portion is located opposed to the plurality of heat-generating regions,
wherein the at least one heat radiating portion is formed by the plurality of convex portions corresponding to the plurality of heat-generating regions, and
wherein at least two walls define the plurality of convex portions.

2. The electronic control apparatus according to claim 1, wherein
the heat radiating portion includes a heat-radiating fin provided to project from a bottom surface of the concave portion between the bottom surface of the concave portion and the outer wall surface.

3. The electronic control apparatus according to claim 1, wherein
the heat-generating electronic component is located between a mounting surface of the circuit board and the convex portion.

4. An electronic control apparatus, comprising:
a housing including a plurality of housing members combined with each other, and
a circuit board received in an internal space of the housing a heat-generating electronic component being mounted on the circuit board,
wherein at least one of the plurality of housing members is opposed to a heat-generating region of the heat-generating electronic component,
wherein the at least one of the plurality of housing members includes at least one heat radiating portion,
wherein the at least one heat radiating portion includes
a convex portion protruding from an inner wall surface of the at least one of the plurality of housing members at a location opposed to the heat-generating region, the convex portion being close to the heat-generating region through a clearance between the convex portion and the heat-generating region, and
a concave portion opened to an outer wall surface of the at least one of the plurality of housing members at a location shifted from the convex portion in a thickness direction of the at least one of the plurality of housing members, the concave portion having a lateral wall formed in a tapered shape such that an opening area of the concave portion is larger than a bottom area of the concave portion,
wherein a thickness of the at least one heat radiating portion is smaller than a thickness of a region peripheral to the at least one heat radiating portion in the at least one of the plurality of housing members,
wherein the heat-generating region is included in a plurality of heat-generating regions,
wherein the heat-generating electronic component is included in a plurality of heat-generating electronic components mounted on the circuit board,
wherein the convex portion is included in a plurality of convex portions,
wherein the at least one heat radiating portion is located opposed to the plurality of heat-generating regions,
wherein the at least one heat radiating portion is formed by the plurality of convex portions corresponding to the plurality of heat-generating regions, wherein each of the plurality of heat-generating electronic components is located between a mounting surface of the circuit board and the corresponding convex portion, and wherein the plurality of convex portions form a multi-level wall shape depending on different sizes of the plurality of heat-generating electronic components in the thickness direction of the at least one of the plurality of housing members.

* * * * *